United States Patent
Lin et al.

(10) Patent No.: US 9,967,975 B2
(45) Date of Patent: May 8, 2018

(54) MULTI-LAYER CIRCUIT BOARD

(71) Applicant: KINSUS INTERCONNECT TECHNOLOGY CORP., Taoyuan (TW)

(72) Inventors: Ting-Hao Lin, Taoyuan (TW); Chiao-Cheng Chang, Taoyuan (TW); Yi-Nong Lin, Taoyuan (TW)

(73) Assignee: KINSUS INTERCONNECT TECHNOLOGY CORP., Taoyuan (TW)

( * ) Notice: Subject to any disclaimer, the term of this patent is extended or adjusted under 35 U.S.C. 154(b) by 0 days. days.

(21) Appl. No.: 15/143,354

(22) Filed: Apr. 29, 2016

(65) Prior Publication Data
US 2017/0318671 A1 Nov. 2, 2017

(51) Int. Cl.
*H05K 1/09* (2006.01)
*H05K 1/02* (2006.01)

(52) U.S. Cl.
CPC ............. *H05K 1/09* (2013.01); *H05K 1/0298* (2013.01)

(58) Field of Classification Search
CPC ........ H05K 1/09; H05K 1/115; H05K 1/0298; H05K 3/429; H05K 3/4602; H05K 3/4652; H05K 2201/096; H05K 2201/09509; H05K 2201/09563; H05K 2201/09827; H05K 2201/09854; H05K 2203/0554

(Continued)

(56) References Cited

U.S. PATENT DOCUMENTS

| | | | |
|---|---|---|---|
| 5,189,507 A * | 2/1993 | Carlomagno | H01L 21/67138 257/724 |
| 5,906,042 A * | 5/1999 | Lan | H01L 23/5382 257/E23.171 |

(Continued)

FOREIGN PATENT DOCUMENTS

| | | | | |
|---|---|---|---|---|
| JP | 2004186354 A | * | 7/2004 | ............... H05K 3/46 |
| JP | 2006196768 A | * | 7/2006 | |

(Continued)

OTHER PUBLICATIONS www.tibtech.com_Feb. 2015.*

*Primary Examiner* — Timothy Thompson
*Assistant Examiner* — Guillermo Egoavil
(74) *Attorney, Agent, or Firm* — Innovation Capital Law Group, LLP; Vic Lin

(57) ABSTRACT

A multi-layer circuit board includes a first circuit board, multiple conducting blocks, a second circuit board, and multiple conducting recesses. The first circuit board has a first conductor layer formed thereon. The conducting blocks are mounted on the first circuit board and electrically connected to the first conductor layer. The second circuit board has a second conductor layer mounted thereon and facing the first circuit board. The conducting recesses are formed in the surface of the second circuit board. Each conducting recess has a conducting layer electrically connected to the second conductor layer. When the conducting blocks are mounted in the conducting recesses, the first conductor layer and the second conductor layer are electrically connected through the conducting blocks and the conducting recesses. As can be separated from the first circuit board for test of the two conductor layers, the yield of the second circuit board is enhanced.

13 Claims, 5 Drawing Sheets

(58) Field of Classification Search
USPC .................. 174/257, 266; 427/97.3, 555
See application file for complete search history.

(56) References Cited

U.S. PATENT DOCUMENTS

| | | | | |
|---|---|---|---|---|
| 6,207,259 | B1* | 3/2001 | Iino | H05K 3/4069 |
| | | | | 174/250 |
| 2011/0010932 | A1* | 1/2011 | Tanaka | H01L 21/4846 |
| | | | | 29/830 |
| 2011/0266140 | A1* | 11/2011 | Kinoshita | G03F 1/24 |
| | | | | 204/192.27 |
| 2014/0041923 | A1* | 2/2014 | Hisada | H05K 1/115 |
| | | | | 174/266 |
| 2015/0136446 | A1* | 5/2015 | Ryu | H05K 1/0271 |
| | | | | 174/251 |
| 2016/0157347 | A1* | 6/2016 | Roessler | H05K 1/115 |
| | | | | 174/262 |

FOREIGN PATENT DOCUMENTS

| | | |
|---|---|---|
| TW | I250555 | 3/2006 |
| TW | 2009042278 | 1/2009 |

\* cited by examiner

MULTI-LAYER CIRCUIT BOARD

BACKGROUND OF THE INVENTION

1. Field of the Invention

The present invention relates to a circuit board and, more particularly, to a multi-layer circuit board facilitating test thereof with conductor layers electrically connected to each other through conducting blocks and conducting recesses formed between each adjacent two boards of the multi-layer circuit board.

2. Description of the Related Art

Circuit boards are products built to reduce the need of wires connected between electronic components and to lower the production cost. As circuits become more and more complicated, the use of multi-layer circuit boards has become commonplace in the electronics industry. With reference to FIGS. 3A and 3B, a conventional multi-layer circuit board includes a first substrate 70, a first conductor layer 71, a second substrate 80 and a second conductor layer 81. The first conductor layer 71 is formed on the first substrate 70. The first conductor layer 71 may be formed by performing photolithography and electroplating processes on the first substrate 70. The second substrate 80 is formed on the first conductor layer 71. The second substrate 80 has a via 82 formed through the second substrate 80. The second conductor layer 81 may be formed by similarly performing photolithography and electroplating processes. The via 82 is filled to generate a via fill conductor 83 which is used to electrically connect the second conductor layer 81 and the first conductor layer 71. Repeating the fabrication process for the second substrate 80 can provide a third substrate and a fourth substrate sequentially stacked on the second substrate 80 in completion of the conventional multi-layer circuit board.

However, in consideration of fabrication processes for the conventional multi-layer circuit board including the second circuit board 80 and all the sequentially stacked substrates, the conventional multi-layer circuit board must be completed prior to any test applied thereto. As each board of the conventional multi-layer circuit board cannot be individually tested, it is uncertain whether the board has a good conductor layer or not. If one of the conductor layers happens to be defective, the defective conductor layer can be only diagnosed upon tests. Even though the conductor layer of one of the boards is defective, as each board is impossible to be individually tested, there is no way to identify the defect of the board during fabrication processes. The defective board and other boards are continuously stacked to each other in completion of the multi-layer circuit board. Once the multi-layer circuit board is found to be inoperable and the whole multi-layer circuit board become useless, such material waste certainly leads to a cost increase. Besides, when the conventional multi-layer circuit board is found to be problematic upon tests, the faulty board of the conventional multi-layer circuit board is hard to be identified because it is infeasible to test the board separately. As the problem of the board is not easily identified and can be rapidly ruled out, the yield of the conventional multi-layer circuit board also suffers.

SUMMARY OF THE INVENTION

An objective of the present invention is to provide a multi-layer circuit board with a higher yield thereof because of each circuit board thereof being separable for ease of test and fast fault diagnosis.

To achieve the foregoing objective, the multi-layer circuit board includes a first circuit board, multiple conducting blocks, a second circuit board, multiple conducting recesses and an insulating layer.

The first circuit board has a first conductor layer mounted on a surface of the first circuit board.

The multiple conducting blocks are mounted on the surface of the first circuit board and are electrically connected to the first conductor layer.

The second circuit board is formed on the surface of the first circuit board and has a first surface and a second surface. The first surface faces the first circuit board. The second conductor layer is mounted on the first surface.

The multiple conducting recesses are formed in the first surface, are electrically connected to the second conductor layer, and correspond to the respective conducting blocks.

The insulating layer is mounted between the first conductor layer and the second conductor layer.

The multiple conducting blocks are respectively mounted in the multiple conducting recesses to electrically connect the first conductor layer and the second conductor layer.

From the foregoing multi-layer circuit board, conductor layers on the circuit boards can be electrically connected when the multiple conducting blocks are mounted in the respective conducting recesses. As the conducting blocks and the conducting recesses are used for electrical connection between circuit boards, after completion of the conductor layer, each circuit board can be tested individually to identify if the conductor layer is defective without having to wait for the completion of the multi-layer circuit board. Accordingly, material waste, low product yield, and cost increase arising from tests and identification of problems only after completion of the multi-layer circuit board can be avoided. Additionally, the insulating layer installed between the conductor layers of two adjacent circuit boards avoids short-circuit occurring between the conductor layers.

Other objectives, advantages and novel features of the invention will become more apparent from the following detailed description when taken in conjunction with the accompanying drawings.

DETAILED DESCRIPTION OF THE INVENTION

Figure 1A:
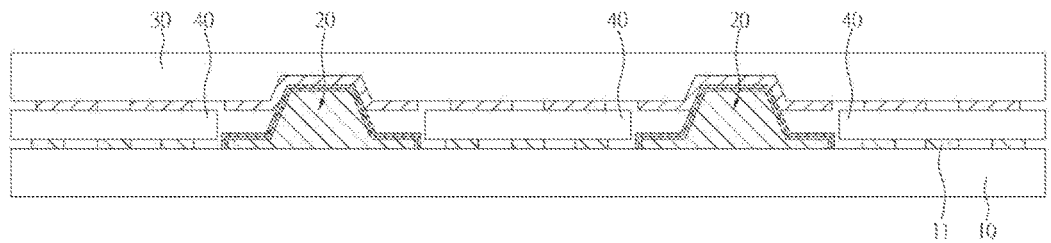
FIG. 1A is a cross-sectional schematic side view of a first embodiment of a multi-layer circuit board in accordance with the present invention.

With reference to FIG. 1A, a multi-layer circuit board in accordance with the present invention includes multiple circuit boards that are stacked to each other and includes a first circuit board 10, multiple first conducting blocks 20, a second circuit board 30 and an insulating layer 40.

Figure 1B:
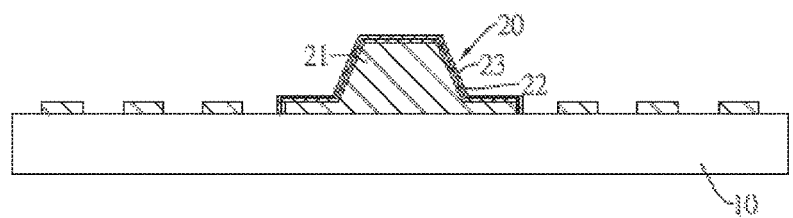
FIG. 1B is a cross-sectional schematic side view of a conducting block of the multi-layer circuit board in FIG. 1A.

With reference to FIG. 1B, the first circuit board 10 has a first conductor layer 11 formed on a surface of the first circuit board 10. A width of a cross-sectional area of each first conducting block 20 progressively decreases in an upward direction from the surface of the first circuit board 10, such that a top area of the first conducting block 20 is less than a bottom area of the first conducting block 20. Each first conducting block 20 has a base layer 21, a strengthening layer 22 and an anti-oxidant layer 23.

The base layer 21 is mounted on the surface of the first circuit board 10 and adjoins the first conductor layer 11. Each first conducting block 20 is electrically connected to the first conductor layer 11. Because copper has good conductivity and low cost, the base layer 21 may be made from copper or a copper alloy.

The strengthening layer 22 is sheathed on the base layer 21 and has higher hardness than the base layer 21 to enhance strength of the first conducting blocks 20. The strengthening layer 22 may be made from one of palladium, nickel, and tungsten, and an alloy thereof.

The anti-oxidant layer 23 is sheathed on the strengthening layer 22 and serves to avoid oxidation of the first conducting blocks 20. Because one of the functions of the first conducting blocks 20 is to become electrically conductive, the first conducting blocks 20 have a higher resistance arising from oxidation thereof. Such increase in resistance causes lower conductivity, degraded signal quality in transmission, and even failure of signal transmission. The anti-oxidant layer 23 is further sheathed on the strengthening layer 22 to avoid oxidation of the strengthening layer 22 and the base layer 21. The anti-oxidant layer 23 may be made from gold or a gold alloy.

Figure 1C:
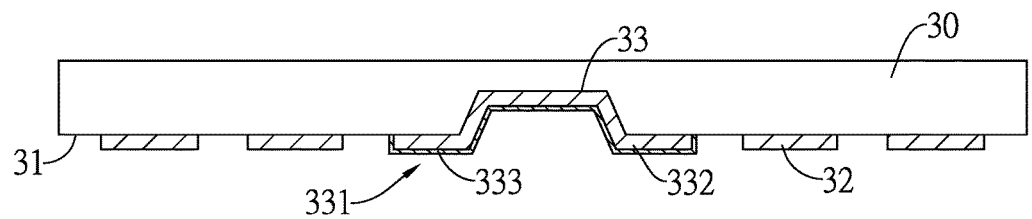
FIG. 1C is a cross-sectional schematic side view of a conducting recess of the multi-layer circuit board in FIG. 1A.
Figure 1D:
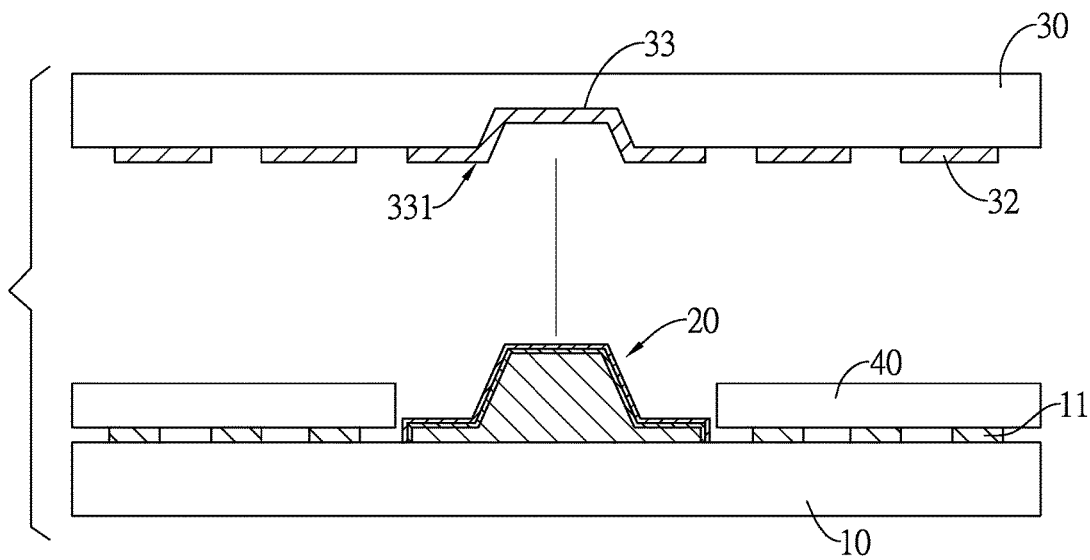
FIG. 1D is an exploded cross-sectional side view of the multi-layer circuit board in FIG. 1A.

With reference to FIGS. 1C and 1D, the second circuit board 30 has a first surface 31, a second conductor layer 32 and multiple first conducting recesses 33. The first surface 31 faces the surface of the first circuit board 10. The second conductor layer 32 is mounted on the first surface 31. The multiple first conducting recesses 32 are formed in the first surface 31. Each first conducting recess 32 has a first conducting layer 331 formed thereon and electrically connected to the second conductor layer 32. The first conducting recesses 33 correspond to the first conducting blocks 20 in shape and engage the respective first conducting blocks 20. When the first conducting blocks 20 are mounted in the respective first conducting recesses 33, the second conductor layer 32 of the second circuit board 30 is electrically connected to the first conductor layer 11 through the first conducting recesses 33 and the first conducting blocks 20 for signal transmission. Moreover, each first conducting layer 331 further has a connection layer 332 and a sheathing layer 333. The connection layer 332 is electrically connected to the second conductor layer 32. In the present embodiment, the connection layer 332 is made from copper. The sheathing layer 333 is wrapped around the connection layer 332 to protect the connection layer 332 and may be made from gold or a gold alloy.

The insulating layer 40 is mounted between the first circuit board 10 and the second circuit board 30 to isolate the first conductor layer 11 from the second conductor layer 32 and avoid short-circuit occurring at an unspecified connected location of the first conductor layer 11 and the second conductor layer 32 because of direct contact of the first conductor layer 11 and the second conductor layer 32. In the present embodiment, the insulating layer 40 is mounted on and wrapped around the first conductor layer 11. Alternatively, the insulating layer 40 may be mounted on the second conductor layer 32.

In one embodiment, the insulating layer 40 is disposed between the first conductor layer 11 and the second conductor layer 32 rather than between the multiple conducting blocks 20 and the multiple conducting recesses 32.

Figure 2A:
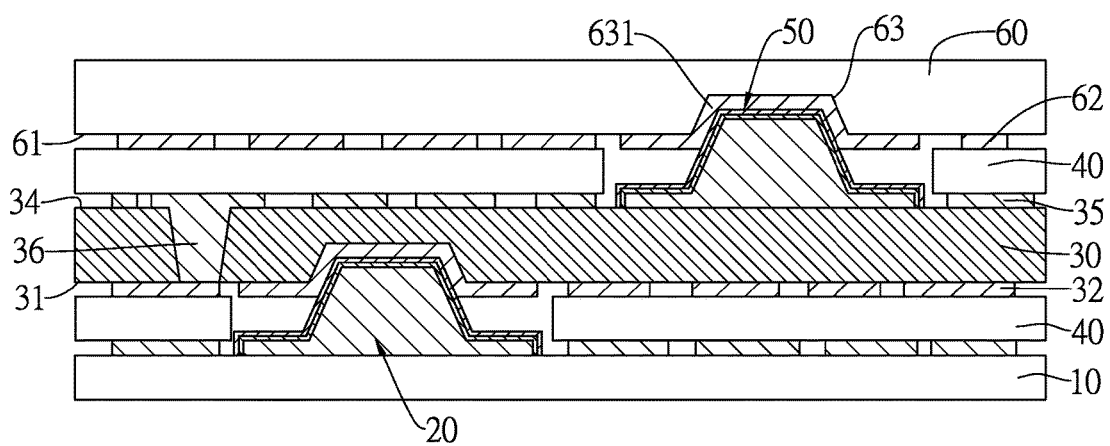
FIG. 2A is a cross-sectional schematic side view of a second embodiment of a multi-layer circuit board in accordance with the present invention.
Figure 2B:
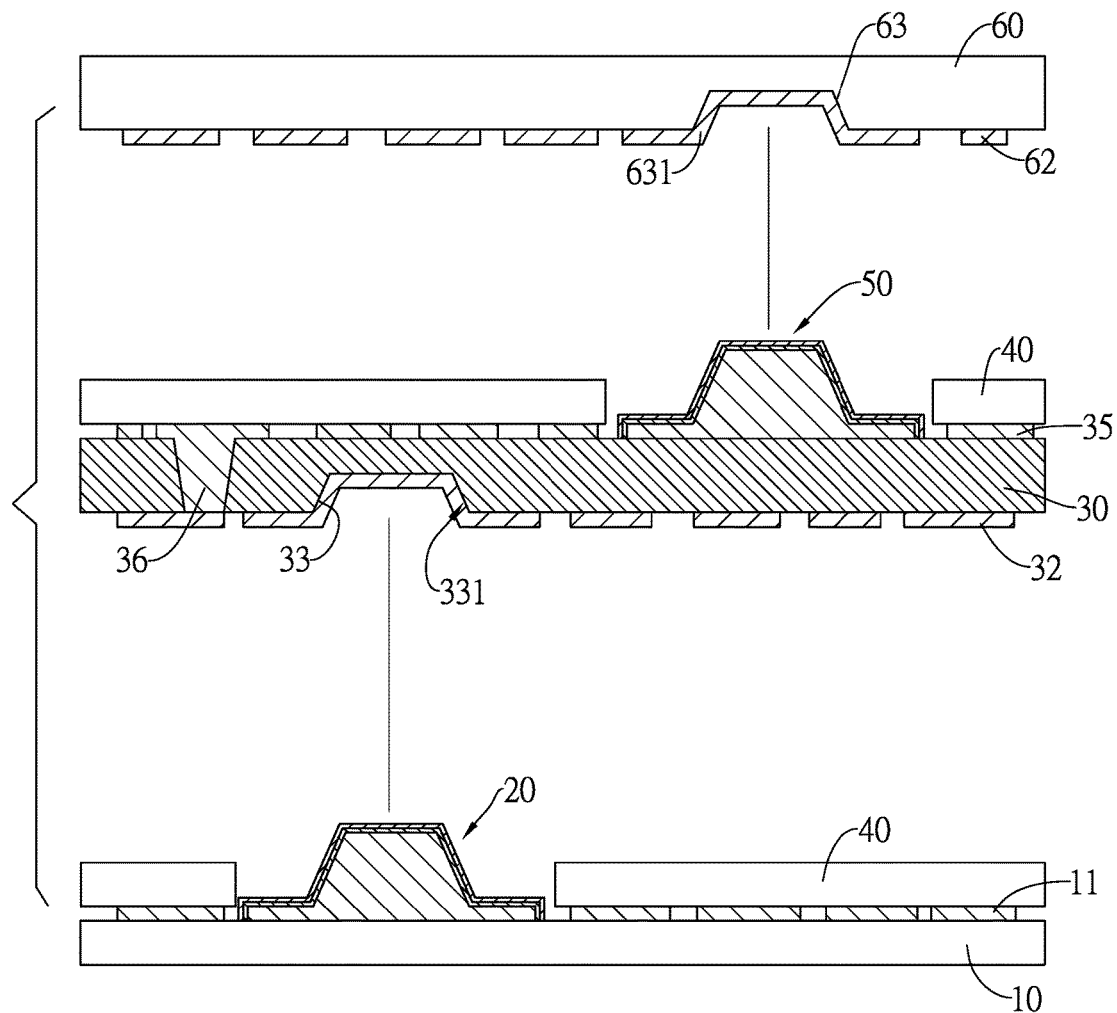
FIG. 2B is an exploded cross-sectional side view of the multi-layer circuit board in FIG. 2A.
Figure 3A:
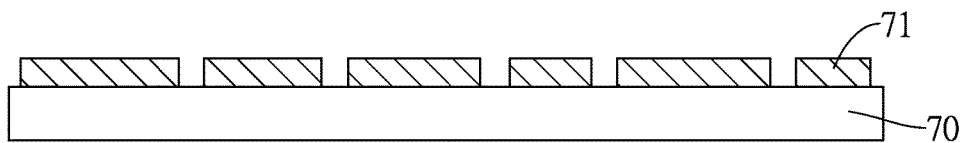
FIG. 3A is a cross-sectional schematic side view of a first circuit board of a conventional multi-layer circuit board.
Figure 3B:
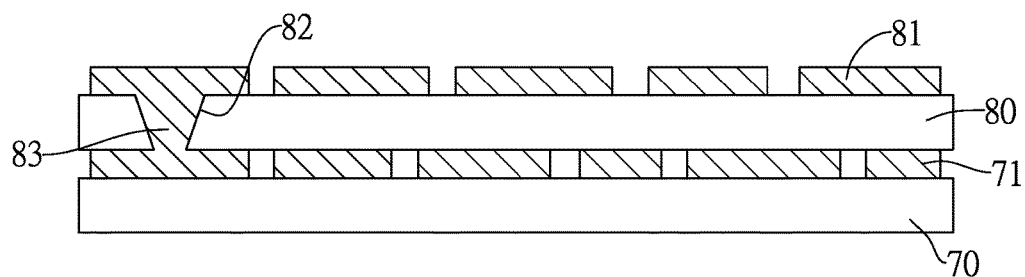
FIG. 3B is a cross-sectional schematic side view of a multi-layer circuit board.

With reference to FIGS. 2A and 2B, a second embodiment of a multi-layer circuit board differs from the first embodiment in that the second circuit board 30 includes a second surface 34, a third conductor layer 35 and multiple second conducting blocks 50 and a third circuit board 60 includes a third surface 61, a fourth conductor layer 62 and multiple second conducting recesses 63. The second surface 34 is opposite to the first surface 31. The third conductor layer 35 is mounted on the second surface 34 and is electrically connected to the second conductor layer 32 through a filled portion 36 inside a via formed through the second circuit board 30. The second conducting blocks 50 are electrically connected to the third conductor layer 35. The third surface 61 faces the second surface 34 of the second circuit board 30. The fourth conductor layer 62 is mounted on the third surface 61. The multiple second conducting recesses 63 are formed in the third surface 61. Each second conducting recess 63 has a second conducting layer 631 formed thereon and electrically connected to the fourth conductor layer 62. The second conducting recesses 63 correspond to the second conducting blocks 50 in shape and engage the respective second conducting blocks 50. When the second conducting blocks 50 are mounted in the respective second conducting recesses 63, the third conductor layer 35 of the second circuit board 30 is electrically connected to the fourth conductor layer 62 through the second conducting blocks 50 and the second conducting recesses 63. Another insulating layer 40 is mounted between the third conductor layer 35 and the fourth conductor layer 62 to avoid short-circuit occurring between the third conductor layer 35 and the fourth conductor layer 62. Thus, an entire structure of the multi-layer circuit board is completed. In the multi-layer circuit board, the second conducting blocks 50 that are structurally and functionally the same as the first conducting blocks 30 and the second conducting recesses 63 that are also structurally and functionally the same as the first conducting recesses 33 are not repeatedly described here.

In one embodiment, each of the insulating layers 40 is disposed between adjacent two conductor layers of two adjacent circuit boards rather than between the multiple conducting blocks and the multiple conducting recesses of two adjacent circuit boards.

In sum, the present invention is involved with a multi-layer circuit board for ease of test and can be applied to multiple circuit boards stacked to each other. Neighboring conductor layers between any two adjacent circuit boards can be electrically connected to each other through corresponding conducting blocks and conducting recesses, such that after the completion of the conductor layer on each circuit board, the circuit board can be tested separately. When being faulty, the circuit board can be immediately diagnosed to pinpoint the cause of the fault and replaced. As the multi-layer circuit board can be tested as a whole prior to the completion thereof, discarded multi-layer circuit board can be effectively reduced to enhance the yield and lower the production cost of the multi-layer circuit board.

Additionally, given the conductor layers formed on the top surface and the bottom surface of the multi-layer circuit board and electrically connected to each other through the filled portions inside vias, the quantity of circuit boards in use can be reduced to keep the cost of the multi-layer circuit board down.

Even though numerous characteristics and advantages of the present invention have been set forth in the foregoing description, together with details of the structure and function of the invention, the disclosure is illustrative only. Changes may be made in detail, especially in matters of shape, size, and arrangement of parts within the principles of the invention to the full extent indicated by the broad general meaning of the terms in which the appended claims are expressed.

What is claimed is:

1. A multi-layer circuit board, comprising:
    a first circuit board, having:
        a first conductor layer mounted on a surface of the first circuit board;
    multiple conducting blocks mounted on the surface of the first circuit board and electrically connected to the first conductor layer, wherein each conducting block has:
        a base layer electrically connected to the first conductor layer;
        a strengthening layer sheathed on the base layer; and
        an anti-oxidant layer sheathed on the strengthening layer;
    a second circuit board, having:
        a first surface facing the first circuit board; and
        a second conductor layer mounted on the first surface of the second circuit board;
    multiple conducting recesses formed in the first surface of the second circuit board, electrically connected to the second conductor layer, and corresponding to the respective conducting blocks; and
    an insulating layer mounted between the first conductor layer and the second conductor layer;
    wherein the second circuit board is on the surface of the first circuit board, the multiple conducting blocks are respectively mounted in the multiple conducting recesses to electrically connect the first conductor layer and the second conductor layer.

2. The multi-layer circuit board as claimed in claim 1, wherein the base layers of the conducting block and the first conductor layer are made from an identical material.

3. The multi-layer circuit board as claimed in claim 1, wherein the base layer is made from one of copper and a copper alloy.

4. The multi-layer circuit board as claimed in claim 3, wherein the strengthening layer is made from one of palladium, nickel, and tungsten and an alloy thereof.

5. The multi-layer circuit board as claimed in claim 4, wherein the anti-oxidant layer is made from gold and tin, and an alloy thereof.

6. A multi-layer circuit board, comprising:
    a first circuit board, having:
        a first conductor layer mounted on a surface of the first circuit board;
    multiple conducting blocks mounted on the surface of the first circuit board and electrically connected to the first conductor layer;
    a second circuit board, having:
        a first surface facing the first circuit board; and
        a second conductor layer mounted on the first surface of the second circuit board;
    multiple conducting recesses formed in the first surface of the second circuit board, electrically connected to the second conductor layer, and corresponding to the respective conducting blocks; and
    an insulating layer mounted between the first conductor layer and the second conductor layer;
    wherein the second circuit board is on the surface of the first circuit board, the multiple conducting blocks are respectively mounted in the multiple conducting recesses to electrically connect the first conductor layer and the second conductor layer;
    wherein each conducting recess has a conducting layer formed thereon and electrically connected to the second conductor layer;
    wherein each conducting layer has:
        a connection layer made from copper; and
        a sheathing layer made from one of gold and a gold alloy.

7. The multi-layer circuit board as claimed in claim 6, wherein the multiple conducting recesses correspond to the multiple conducting blocks in shape.

8. The multi-layer circuit board as claimed in claim 1, wherein each conducting layer has:
    a connection layer made from copper; and
    a sheathing layer made from one of gold and a gold alloy.

9. The multi-layer circuit board as claimed in claim 2, wherein each conducting layer has:
    a connection layer made from copper; and
    a sheathing layer made from one of gold and a gold alloy.

10. The multi-layer circuit board as claimed in claim 3, wherein each conducting layer has:
    a connection layer made from copper; and
    a sheathing layer made from one of gold and a gold alloy.

11. The multi-layer circuit board as claimed in claim 4, wherein each conducting layer has:
    a connection layer made from copper; and
    a sheathing layer made from one of gold and a gold alloy.

12. The multi-layer circuit board as claimed in claim 5, wherein each conducting layer has:
    a connection layer made from copper; and
    a sheathing layer made from one of gold and a gold alloy.

13. The multi-layer circuit board as claimed in claim 1, wherein the insulating layer is disposed between the first conductor layer and the second conductor layer rather than between the multiple conducting blocks and the multiple conducting recesses.

\* \* \* \* \*